US010651302B2

(12) United States Patent
Sakurai et al.

(10) Patent No.: US 10,651,302 B2
(45) Date of Patent: May 12, 2020

(54) SEMICONDUCTOR DEVICE

(71) Applicant: FUJI ELECTRIC CO., LTD., Kanagawa (JP)

(72) Inventors: Yosuke Sakurai, Azumino (JP); Yuichi Onozawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/015,198

(22) Filed: Jun. 22, 2018

(65) Prior Publication Data

US 2018/0301550 A1 Oct. 18, 2018

Related U.S. Application Data

(63) Continuation of application No. PCT/JP2017/026160, filed on Jul. 19, 2017.

(30) Foreign Application Priority Data

Jul. 19, 2016 (JP) ................................ 2016-141284

(51) Int. Cl.
*H01L 29/739* (2006.01)
*H01L 29/10* (2006.01)
(Continued)

(52) U.S. Cl.
CPC ...... *H01L 29/7397* (2013.01); *H01L 29/0626* (2013.01); *H01L 29/0684* (2013.01);
(Continued)

(58) Field of Classification Search
None
See application file for complete search history.

(56) References Cited

U.S. PATENT DOCUMENTS

2002/0006703 A1* 1/2002 Pfirsch ................. H01L 29/045
438/268
2005/0263852 A1* 12/2005 Ogura ................. H01L 29/0834
257/565
(Continued)

FOREIGN PATENT DOCUMENTS

JP 2001127286 A 5/2001
JP 2002533936 A 10/2002
(Continued)

OTHER PUBLICATIONS

International Search Report for International Patent Application No. PCT/JP20171026160, issued by the Japan Patent Office dated Oct. 3, 2017.

*Primary Examiner* — Shaun M Campbell

(57) ABSTRACT

A semiconductor device including: a semiconductor substrate; a drift region of first conductivity type that is formed in the semiconductor substrate; an accumulation region of first conductivity type that is formed above the drift region and has higher concentration than concentration of the drift region; a base region of second conductivity type that is formed above the accumulation region; and a gate trench portion that is formed extending from an upper surface of the semiconductor substrate to the drift region, passing through the base region and the accumulation region, wherein a maximum value of doping concentration of the accumulation region is greater than a maximum value of doping concentration of the base region will be provided.

14 Claims, 17 Drawing Sheets

(51) Int. Cl.
 *H01L 29/40* (2006.01)
 *H01L 29/06* (2006.01)
(52) U.S. Cl.
 CPC ........ *H01L 29/1045* (2013.01); *H01L 29/404* (2013.01); *H01L 29/407* (2013.01)

(56) References Cited

U.S. PATENT DOCUMENTS

| | | | |
|---|---|---|---|
| 2005/0263853 A1* | 12/2005 | Tomomatsu | H01L 29/0834 257/565 |
| 2008/0197379 A1 | 8/2008 | Aono et al. | |
| 2013/0092978 A1* | 4/2013 | Sugawara | H01L 29/7395 257/139 |
| 2014/0061717 A1 | 3/2014 | Song et al. | |
| 2014/0077293 A1* | 3/2014 | Kitagawa | H01L 29/7827 257/330 |

FOREIGN PATENT DOCUMENTS

| | | | |
|---|---|---|---|
| JP | 2005347289 A | 12/2005 |
| JP | 2008205015 A | 9/2008 |
| JP | 2010114136 A | 5/2010 |
| JP | 2013089700 A | 5/2013 |
| JP | 2014022708 A | 2/2014 |
| JP | 2014060362 A | 4/2014 |
| JP | 2015207784 A | 11/2015 |

\* cited by examiner

SEMICONDUCTOR DEVICE

The contents of the following Japanese patent application(s) are incorporated herein by reference:
NO. 2016-141284 filed in JP on Jul. 19, 2016,
NO. PCT/JP2017/026160 filed on Jul. 19, 2017.

BACKGROUND

1. Technical Field

The present invention relates to a semiconductor device.

2. Related Art

Conventionally, in semiconductor devices such as IGBT (Insulated Gate Bipolar Transistor), devices having trench gate structures are known (for example, refer to Patent Document 1 and 2).
Patent Document 1: Japanese Patent Application Publication No. 2010-114136.
Patent Document 2: Japanese Patent Application Publication No. 2008-205015.
In IGBTs having trench gate structures, the density of holes implanted from collectors by conductivity modulation are decreased as getting closer to emitters. As a result, carrier density gets decreased on the emitter side, and ON-resistance can not be made sufficiently small. By an accumulation region of (N)-type being provided below a base region of (P)-type, the carrier density on the emitter side can be improved. However, accumulation of holes was not sufficient in conventional accumulation regions.

General Disclosure

An aspect of the present invention provides a semiconductor device. The semiconductor device may include a semiconductor substrate. The semiconductor device may include a drift region of first conductivity type that is formed in the semiconductor substrate. The semiconductor device may include an accumulation region of the first conductivity type that is formed above the drift region and has higher concentration than that of the drift region. The semiconductor device may include a base region of second conductivity type that is formed above the accumulation region. The semiconductor device may include a gate trench portion that is formed extending from the upper surface of the semiconductor substrate to the drift region, passing through the base region and the accumulation region. A maximum value of the doping concentration of the accumulation region may be greater than a maximum value of the doping concentration of the base region.

The maximum value of the doping concentration of the accumulation region may be five times the maximum value of the doping concentration of the base region or smaller. The maximum value of the doping concentration of the accumulation region may be 1.5 times the maximum value of the doping concentration of the base region or greater.

Integrated concentration that is obtained by integrating doping concentration of the accumulation region in the depth direction of the semiconductor substrate may be four times the integrated concentration that is obtained by integrating doping concentration of the base region in the depth direction of the semiconductor substrate or less. Integrated concentration that is obtained by integrating doping concentration of the accumulation region in the depth direction of the semiconductor substrate may be less than the integrated concentration that is obtained by integrating doping concentration of the base region in the depth direction of the semiconductor substrate.

A doping concentration distribution of the accumulation region in the depth direction has multiple peaks, and doping concentration at a peak closest to the base region among the multiple peaks may be lower than doping concentration at a peak closest to the drift region. The doping concentration distribution of the base region in the depth direction may have multiple peaks. Among the multiple peaks of the doping concentration distribution of the base region, the doping concentration at a peak closest to the upper surface of the semiconductor substrate may be higher than doping concentration at a peak closest to the accumulation region. Upper integrated concentration that is obtained by integrating the doping concentration of the base region above the center in the depth direction of the base region may be more than lower integrated concentration that is obtained by integrating the doping concentration of the base region below the center in the depth direction of the base region. A depth position where doping concentration of the accumulation region takes the maximum value may be closer to the drift region than the center of the accumulation region in the depth direction.

The semiconductor device may further include a dummy trench portion that is formed extending from the upper surface of the semiconductor substrate to the drift region, passing through the base region and the accumulation region. In the accumulation region, the doping concentration of parts adjacent to the dummy trench portions may be higher than the doping concentration of parts adjacent to the gate trench portions.

A length of the accumulation region in the depth direction may be smaller than or equal to a length of the base region in the depth direction. The length of the accumulation region in the depth direction may be smaller than or equal to a length of a protruding part of the gate trench portion below the bottom end of the accumulation region.

The accumulation region may be a region that is formed sandwiched by two of the gate trench portions lined up in the lateral direction. The length of the accumulation region in the depth direction may be smaller than an interval in the lateral direction between the central portions of two of the gate trench portions. An integrated value that is obtained by integrating doping concentration of the accumulation region in a lateral direction at the depth position corresponding to a peak concentration in the doping concentration distribution of the accumulation region in the depth direction may be greater than half the value of critical integrated concentration of the accumulation region.

The gate trench portion may have: a trench that is formed extending from the upper surface of the semiconductor substrate to the drift region, passing through the base region and the accumulation region; an insulating film that is formed on an inner wall in the trench; a gate conductive portion that is formed facing the base region inside the trench; and a dummy conductive portion that is formed below the gate conductive portion and insulated from the gate conductive portion. At least partial region of the accumulation region may be formed facing the dummy conductive portion. The accumulation region may contact with the drift region.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in a direction parallel to a depth direction of a semiconductor substrate is referred to as an "upper" side, and the other side is referred to as a "lower" side. Also, in a substrate, layers or other members, one of the respective two principal surfaces is referred to as an upper surface, and the other surface is referred to as a lower surface. The "upper" and "lower" directions are not limited to the gravitational direction. In the embodiments, an example is illustrated where the first conductivity type is (N)-type and the second conductivity type is (P)-type, but conductivity types of the substrate, the layers, the regions or the like may have opposite polarities, respectively.

In the present specification, the doping concentration refers to the concentration of impurities that are doped to be made donors or acceptors. In the present specification, difference in concentrations of donors and acceptors may be regarded as doping concentration. Also, a peak value of the doping concentration distribution of the doping region may be regarded as doping concentration of the doping region.

Figure 1:
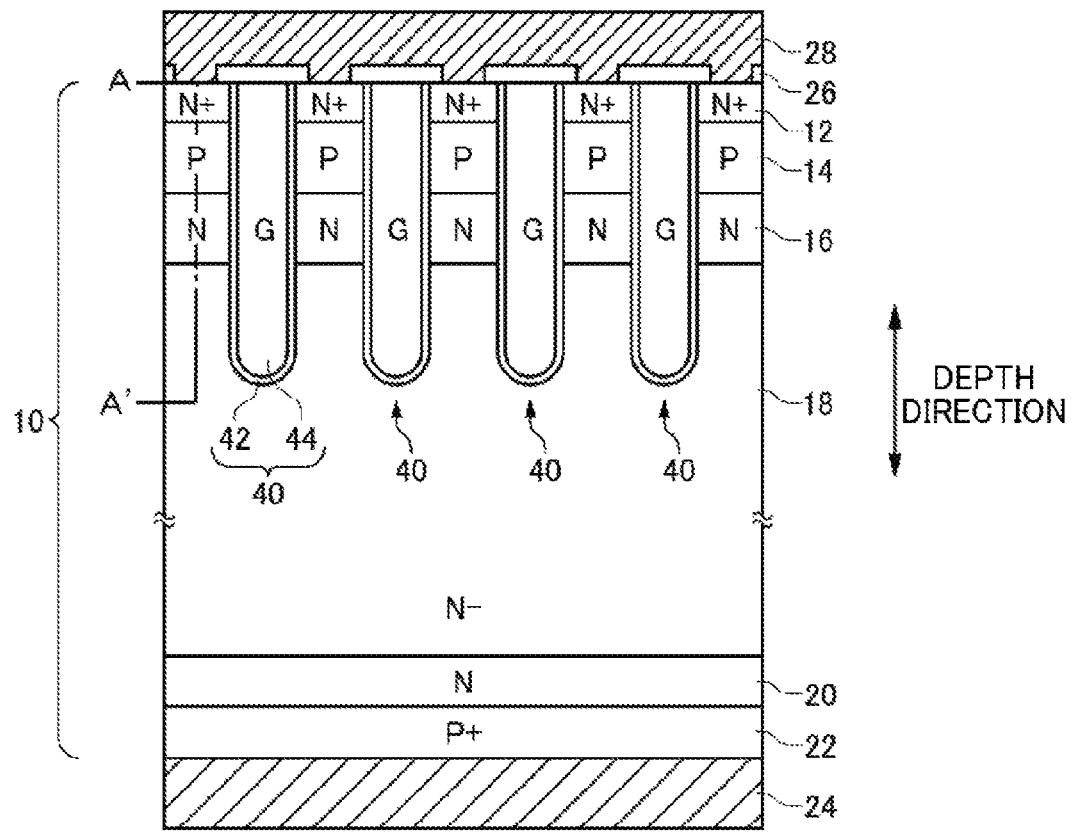
FIG. 1 is a diagram illustrating a cross section of a semiconductor device 100 according to an embodiment of the present invention.

FIG. 1 is a diagram illustrating a cross section of a semiconductor device 100 according to an embodiment of the present invention. Members shown in FIG. 1 are formed extending in a direction perpendicular to the sheet of paper of the drawing. The semiconductor device 100 is a device to reduce ON-resistance (ON-voltage) by conductivity modulation. FIG. 1 illustrates, as an example of the semiconductor device 100, a semiconductor chip where IGBT is formed. The semiconductor device 100 in the present example has, in the cross section, a semiconductor substrate 10, an interlayer dielectric film 26, an emitter electrode 28 and a collector electrode 24.

On an upper surface of the semiconductor substrate 10, the interlayer dielectric films 26 are formed. The interlayer dielectric films 26 are, for example, silicate glass films with phosphorous added (PSG film), or silicate glass films with phosphorous and boron added (BPSG film).

Above the upper surface of the semiconductor substrate 10, the emitter electrode 28 is formed. The emitter electrode 28 in the present example is formed on an upper surface of the interlayer dielectric films 26. The emitter electrode 28 may contact with a partial region of the upper surface of the semiconductor substrate 10. The interlayer dielectric films 26 in the present example have openings to expose the emitter regions 12 that are formed in the vicinity of the upper surface of the semiconductor substrate 10. The emitter electrode 28 is also formed inside the openings and contacts with the emitter regions 12. The interlayer dielectric films 26 insulates the emitter electrode 28 and the gate conductive portions 44 from each other.

On a lower surface of the semiconductor substrate 10, the collector electrode 24 is formed. The emitter electrode 28 and the collector electrode 24 are formed of conductive material such as metal. The emitter electrode 28 and the collector electrode 24, for example may be formed of conductive material including aluminum. Also, parts formed in fine regions such as openings of the insulating films in the emitter electrode 28 and the collector electrode 24 may also be formed of conductive material including tungsten. In the present specification, a surface closer to emitter electrode 28 of the members such as the substrate, the layers, and the regions is referred to as an upper surface, and a surface closer to collector electrode 24 is referred to as a lower surface. Also, a direction connecting the emitter electrode 28 and the collector electrode 24 is referred to as a depth direction of the semiconductor substrate 10.

The semiconductor substrate 10 may be a silicon substrate, or may also be a compound semiconductor substrate such as a silicon carbide substrate or a nitride semiconductor substrate. Inside the semiconductor substrate 10, in the following order from the upper surface side of the semiconductor substrate 10, the emitter regions 12 of (N+)-type, base regions 14 of (P)-type, accumulation regions 16 of (N)-type, drift region 18 of (N−)-type and the collector region 22 of (P+)-type are provided. Also, between the drift region 18 and the collector region 22, a buffer region 20 of (N)-type may be formed.

The drift region 18 in the present example is of (N−)-type. As an example, a remaining region, in the semiconductor substrate 10 of (N−)-type, where the emitter regions 12, the base regions 14, the accumulation regions 16, the buffer region 20, the collector region 22 and the like are not formed, functions as the drift region 18.

The emitter regions 12, accumulation regions 16 and the buffer region 20 have the same conductivity type as that of the drift region 18, and higher doping concentration than that of the drift region 18. The base regions 14 and the collector region 22 have the opposite conductivity type to that of the drift region 18. By the accumulation regions 16 having high concentration being provided between the base regions 14 and the drift region 18, holes implanted from the collector side into the drift region 18 are suppressed from passing through the upper surface side of the semiconductor substrate 10, and carrier density on the upper surface side of the drift region 18 can be made high. By making the carrier density high, the ON-resistance of the semiconductor device 100 can be reduced by the conductivity modulation of the semiconductor device 100.

The accumulation regions 16 in the present example are provided contacting with the drift region 18. For example, between the accumulation regions 16 and the drift region 18, a region of (P)-type is not formed.

Also, by the buffer region 20 having the high concentration provided between the collector region 22 and the drift region 18, a depletion layer which expands from the lower surface side of the base regions 14 can be suppressed from reaching the collector region 22. That is, the buffer region 20 in the present example functions as a field stop layer.

Also, inside the semiconductor substrate 10, one or more gate trench portions 40 are formed, the gate trench portion 40 extending from the upper surface of the semiconductor substrate 10 to the drift region 18 passing through the emitter region 12, the base region 14 and the accumulation region 16. Each gate trench portion 40 has a trench that is formed from the upper surface of the semiconductor substrate 10 to the drift region 18, a gate insulating film 42 that is formed on an inner wall of the trench, and the gate conductive portion 44 that is formed, surrounded by the gate insulating film 42, inside the trench. The multiple gate trench portions 40 may be formed in stripes on the upper surface of the semiconductor substrate 10. In the cross section shown in FIG. 1, the emitter regions 12, the base regions 14 and the accumulation regions 16 are formed in regions of the semiconductor substrate 10 sandwiched by two of the gate trench portions 40. On the upper surface of the semiconductor substrate 10, the emitter regions 12 of (N+)-type and a contact region of (P+)-type may be provided in the regions sandwiched by two of the gate trench portions 40. The emitter regions 12 and the contact region may be alternately arranged in the direction perpendicular to the sheet of paper in FIG. 1. The emitter region 12 may contact with both of its adjacent two of the gate trench portions 40. The contact region contacting with the emitter regions 12 in the direction perpendicular to the sheet of paper in FIG. 1 may also contact with both of its adjacent two of the gate trench portions 40.

As an example, the gate insulating film 42 is an oxide film that is formed by thermal oxidizing the inner wall of the trench, or a nitride film that is formed by nitriding the inner wall of the trench. The gate insulating film 42 insulates the gate conductive portion 44 and the semiconductor substrate 10 from each other. As an example, the gate conductive portion 44 is formed of polysilicon to which impurities added. An upper surface of the gate conductive portion 44 is covered with the interlayer dielectric film 26. However, at positions different from those in the cross section shown in FIG. 1, openings are formed on the interlayer dielectric films 26 to expose the gate conductive portions 44. In the openings, part of a gate metal layer is formed, the gate metal layer being of metal material and formed above the semiconductor substrate 10. Thereby, the gate conductive portions 44 are electrically connected to the gate metal layer.

The gate conductive portion 44 includes at least a region facing its adjacent base region 14. When predetermined voltage is applied to the gate conductive portions 44, channels are formed on interfacing surface layers, in the base regions 14, contacting with the gate trench portions 40. The gate conductive portions 44 in the present example have parts protruding toward the lower surface side of the semiconductor substrate 10 below the lower surfaces of the accumulation regions 16.

Figure 2A:
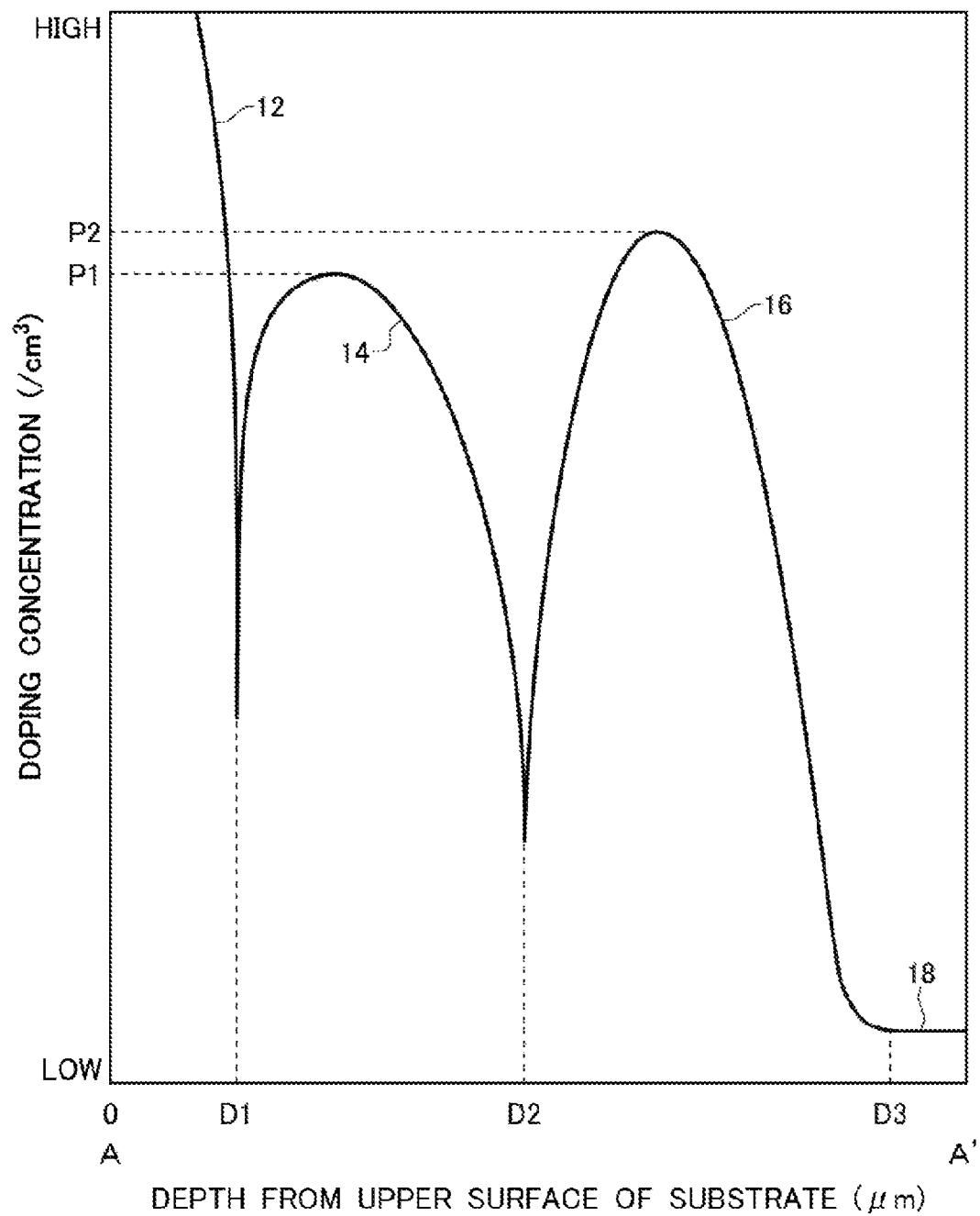
FIG. 2A is a diagram illustrating an exemplary doping concentration distribution of a semiconductor substrate 10 in a depth direction.

FIG. 2A is a diagram illustrating an exemplary doping concentration distribution of a semiconductor substrate 10 in a depth direction. In FIG. 2A, the horizontal axis represents a depth from the upper surface of the semiconductor substrate 10, and the vertical axis represents doping concentration per unit volume in logarithmic.

Also, in FIG. 2A, as shown in the A-A' cross section in FIG. 1, a doping concentration distribution of the emitter region 12, the base region 14, the accumulation region 16 and the drift region 18 is shown. In FIG. 2A, a depth of a border between the emitter region 12 and the base region 14 is regarded as D1, a depth of a border between the base region 14 and the accumulation region 16 is regarded as D2, and a depth of a border between the accumulation regions 16 and the drift region 18 is D3. The depths D1, D2, and D3 refer to the depth from the upper surface of the semiconductor substrate 10.

In the present example, a maximum value P2 of the doping concentration of the accumulation region 16 is greater than a maximum value P1 of the doping concentration of the base region 14. Thereby, a carrier accumulation effect in the accumulation region 16 is improved and the ON-resistance can be reduced.

Figure 2B:
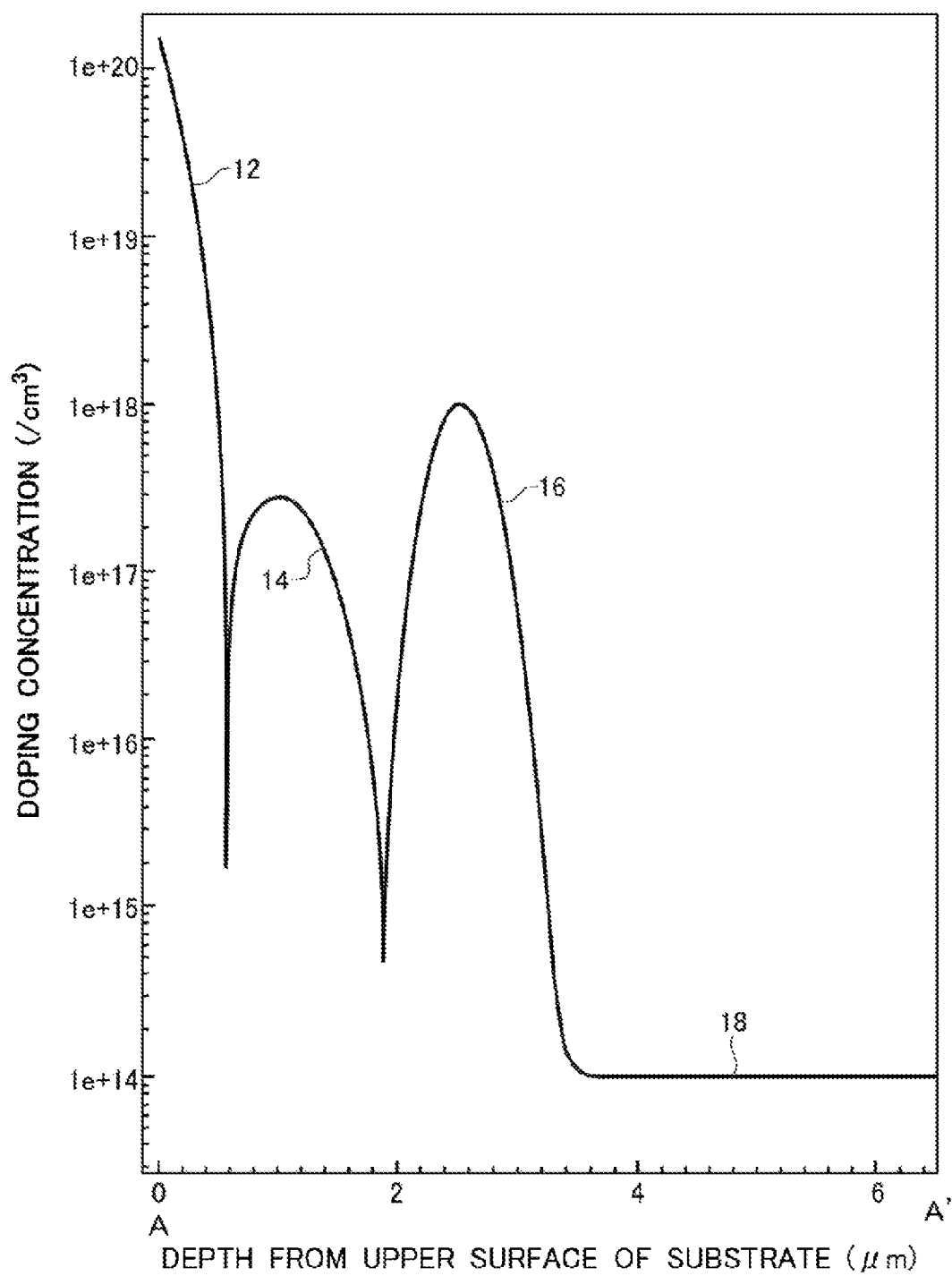
FIG. 2B is a diagram illustrating doping concentration and a depth position of an emitter region 12, a base region 14, an accumulation region 16 and a drift region 18, in an example.

FIG. 2B is a diagram illustrating doping concentration and the depth position of the emitter region 12, the base region 14, the accumulation region 16 and the drift region 18, in an example. The emitter region 12 in the present example shows the maximum doping concentration in vicinity of the upper surface of the semiconductor substrate 10 (i.e. in vicinity of the depth of 0 μm). The maximum value of the doping concentration of the emitter region 12 in the present example is $1.0 \times 10^{20}/cm^3$ or above.

In the present example, a border position between the emitter region 12 and the base region 14 is arranged within a range of 0.5-1 μm from the upper surface of the semiconductor substrate 10. In the present example, the maximum value of the doping concentration of the base region 14 is $5.0\times10^{16}/cm^3$ or above, and $5.0\times10^{17}/cm^3$ or below. In the present example, a depth position where doping concentration of the base region 14 reaches its maximum is arranged within a range of 0.8-1.8 μm from the upper surface of the semiconductor substrate 10.

In the present example, a border position between the base region 14 and the accumulation region 16 is arranged within a range of 1.5-2.5 μm from the upper surface of the semiconductor substrate 10. In the present example, the maximum value of the doping concentration of the accumulation region 16 is $5.0\times10^{17}/cm^3$ or above, and $5.0\times10^{18}/cm^3$ or below. In the present example, a depth position where doping concentration of the accumulation region 16 reaches its maximum is arranged within a range of 2-3 μm from the upper surface of the semiconductor substrate 10.

In the present example, a border position between the accumulation region 16 and the drift region 18 is arranged within a range of 3-4 μm from the upper surface of the semiconductor substrate 10. In the present example, the drift region 18 has doping concentration that is approximately constant. In the present example, the doping concentration of the drift region 18 is $5.0\times10^{13}/cm^3$ or above, and $5.0\times10^{14}/cm^3$ or below.

Figure 3:
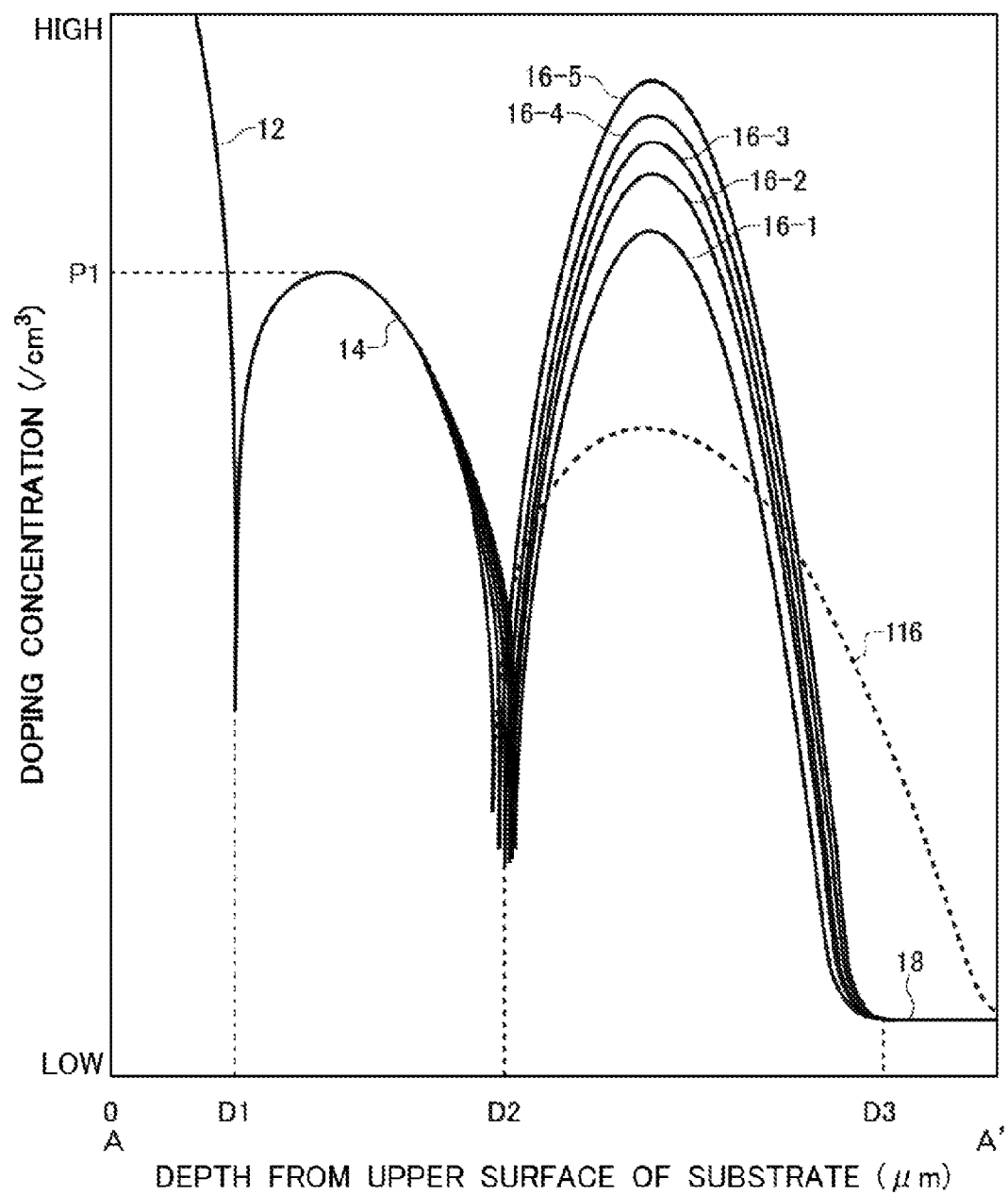
FIG. 3 is a diagram illustrating exemplary doping concentration distributions in examples and a comparative example where the doping concentration of the accumulation region 16 is varied.

FIG. 3 is a diagram illustrating an exemplary doping concentration distribution in examples and a comparative example where the doping concentration of the accumulation region 16 is varied. In FIG. 3, the horizontal axis represents a depth from the upper surface of the semiconductor substrate 10, and the vertical axis represents doping concentration per unit volume in logarithmic. Among the examples, maximum value P1 of the doping concentration of the base region 14 is the same as each other. As an example, the maximum value P1 of the doping concentration of the base region 14 is approximately $1.0\times10^{17}/cm^3$ or above, and $5.0\times10^{17}/cm^3$ or below.

A maximum value of the doping concentration of the accumulation region 16-1 in a first example is about 1.7 times the doping concentration of the base region 14. A maximum value of the doping concentration of the accumulation region 16-2 in a second example is about three times the maximum value of the doping concentration of the base region 14. A maximum value of the doping concentration of the accumulation region 16-3 in a third example is about five times the maximum value of the doping concentration of the base region 14. A maximum value of the doping concentration of the accumulation region 16-4 in a fourth example is about seven times the maximum value of the doping concentration of the base region 14. A maximum value of the doping concentration of the accumulation region 16-5 in a fifth example is about ten times the maximum value of the doping concentration of the base region. A maximum value of the doping concentration of the accumulation region 116 in a comparative example is about 0.2 times the maximum value of the doping concentration of the base region 14.

Figure 4:
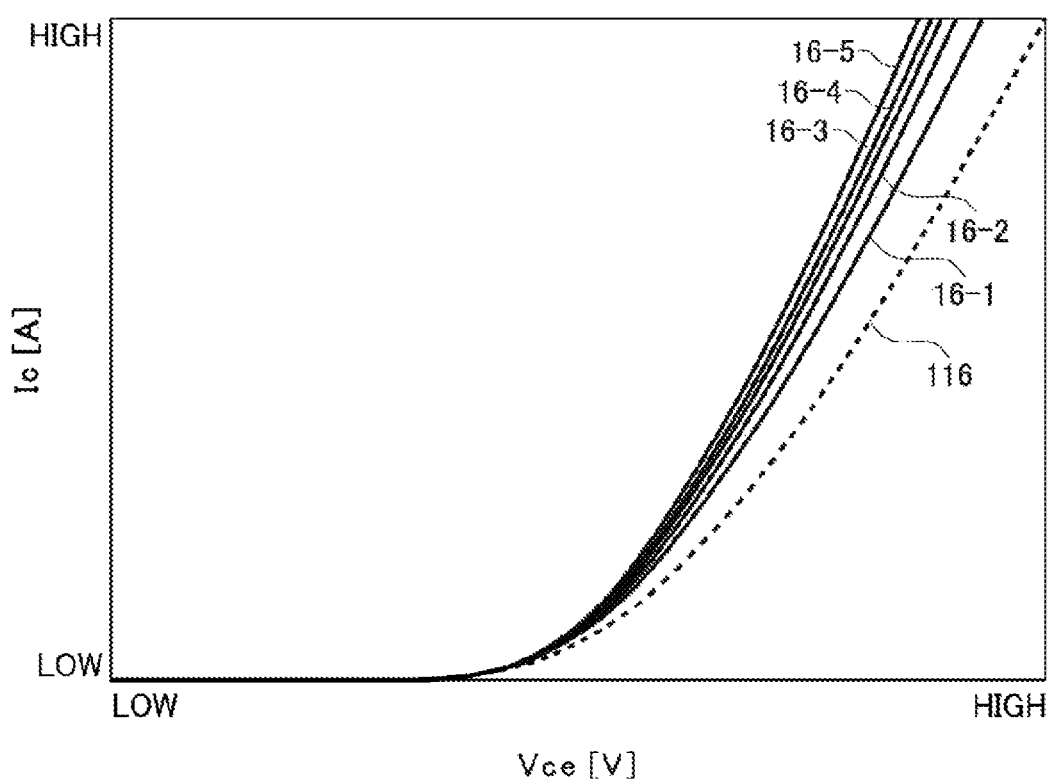
FIG. 4 is a diagram illustrating relationships, in the examples and the comparative example, between collector-emitter voltage Vce in ON state and collector current Ic.

FIG. 4 is a diagram illustrating a relationship, in the examples and the comparative example, between collector-emitter voltage Vce in ON state and collector current Ic. As shown in FIG. 4, the ON-voltages (Vce) in the examples are lower than the ON-voltage in the comparative example (116) when the same collector current Ic flows. The more increased is the maximum value of the doping concentration of the accumulation region 16, the more decreased is the ON-voltage. A maximum value of the doping concentration of the accumulation region 16 may be 1.5 times the maximum value of the doping concentration of the base region 14 or greater, or may be twice the maximum value of the doping concentration of the base region 14 or greater.

Figure 5:
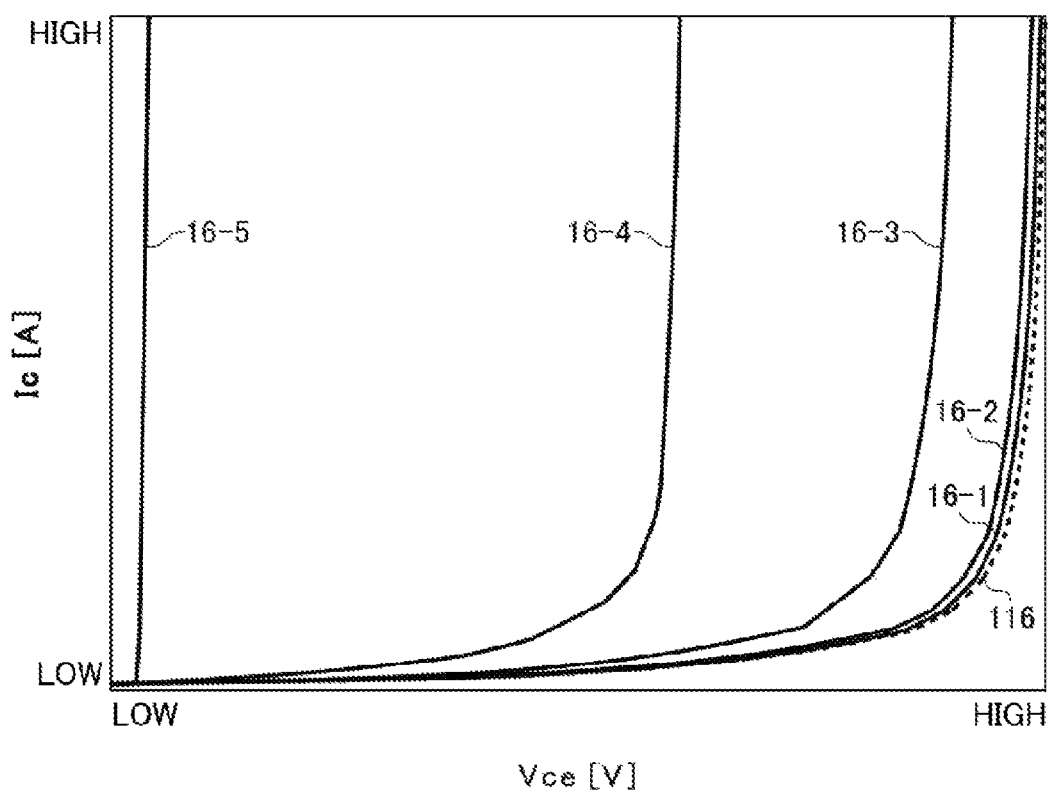
FIG. 5 is a diagram illustrating relationships in the examples and the comparative example between collector-emitter voltage Vce and collector current Ic when gate voltage is lower than or equal to a threshold, e.g. when 0 V is applied.

FIG. 5 is a diagram illustrating a relationship in the examples and the comparative example between collector-emitter voltage Vce and collector current Ic when gate voltage is lower than or equal to a threshold, e.g. when 0 V is applied. In FIG. 5, voltage at which the collector current Ic increases steeply indicates withstand voltage of the semiconductor device 100. In FIG. 5, the vertical axis and the horizontal axis are different from those in FIG. 4 in the order. For example, the maximum value of the horizontal axis in FIG. 4 is about a few V, whereas the maximum value of the horizontal axis in FIG. 5 is about a few hundred V to a few thousand V.

As shown in FIG. 5, when the maximum value of the doping concentration of the accumulation region 16 is excessively increased, the withstand voltage is rapidly decreased. In the example in FIG. 5, when the maximum value of the doping concentration is increased to approximately that of the fifth example (16-5), the withstand voltage of the semiconductor device 100 becomes extremely small. Thus, a maximum value of the doping concentration of the accumulation region 16 may be seven times the maximum value of the doping concentration of the base region 14 or smaller.

In the fourth example (16-4), the withstand voltage is relatively small. Thus, the maximum value of the doping concentration of the accumulation region 16 may be five times the maximum value of the doping concentration of the base region 14 or smaller. Also, in the first example (16-1) and the second example (16-2), decrease in the withstand voltage can not be seen. Thus, a maximum value of the doping concentration of the accumulation region 16 may be three times the maximum value of the doping concentration of the base region 14 or smaller.

Figure 6:
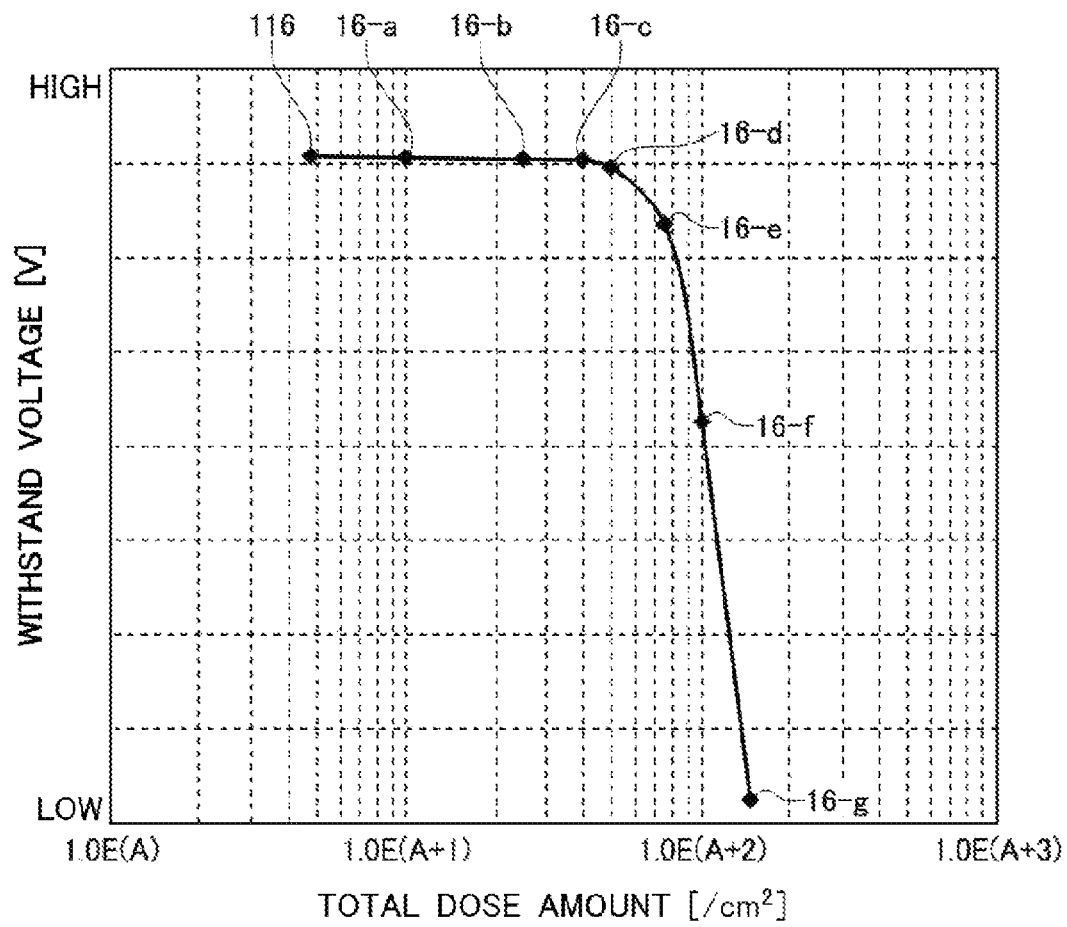
FIG. 6 is a diagram illustrating exemplary withstand voltage in the examples and the comparative example where total dose amount of impurities of the accumulation region 16 is varied.

FIG. 6 is a diagram illustrating exemplary withstand voltage in the examples and the comparative example where total dose amount of impurities of the accumulation region 16 is varied. The withstand voltage in FIG. 6 refers to the collector-emitter voltage Vce at which collector current Ic increases steeply in the diagram shown in FIG. 5. The horizontal axis in FIG. 6 represents the total dose amount in logarithmic. For example, 1.0E(A) represents $1.0\times10^4$.

In the examples, the total dose amount of impurities of the base region 14 is constant. As an example, the total dose amount of the impurities of the base region 14 is $5.0\times10^{12}/cm^2$ or above, and $5.0\times10^{13}/cm^2$ or below. As an example, in the horizontal axis in FIG. 6, A may be A=12. Note that the total dose amount of the base region 14 corresponds to integrated concentration that is obtained by integrating the doping concentration of the base region 14 in the depth direction of the semiconductor substrate 10. For example, the integrated concentration corresponds to a value obtained by multiplying the total dose amount by a predetermined activation ratio. The activation ratio refers to a rate at which impurity ions that is added to the semiconductor substrate 10 are doped to be made donors or acceptors. Similarly, the total dose amount of the accumulation region 16 corresponds to integrated concentration that is obtained by integrating the doping concentration of the accumulation region 16 from the border between the base region 14 and the accumulation region 16 to the border between the accumulation region 16 and the drift region 18 in the depth direction of the semiconductor substrate 10.

The total dose amount of the accumulation region 16-a in the example a is about half the total dose amount of the base region 14. The total dose amount of the accumulation region 16-*b* in the example b is about 1.2 times the total dose amount of the base region 14. The total dose amount of the accumulation region 16-*c* in the example c is about twice the total dose amount of the base region 14. The total dose amount of the accumulation region 16-*d* in the example d is about 2.5 times the total dose amount of the base region 14. The total dose amount of the accumulation region 16-*e* in the example e is about four times the total dose amount of the base region 14. The total dose amount of the accumulation region 16-*f* in the example f is about five times the total dose amount of the base region 14. The total dose amount of the accumulation region 16-*g* in the example g is about seven times the total dose amount of the base region 14. The total dose amount of the accumulation region 116 in the comparative example is about one fourth of the total dose amount of the base region 14.

The withstand voltage in the example f (16-*f*) is significantly decreased as compared with the withstand voltage in the example e (16-*e*). Thus, the total dose amount of the accumulation region 16 is preferably four times the total dose amount of the base region 14 or less. Similarly, the integrated concentration that is obtained by integrating the doping concentration of the accumulation region 16 in the depth direction is preferably four times the integrated concentration of the base region 14 or less.

Note that the total dose amount of the accumulation region 16 may be 0.5 times or more, one time or more, or twice or more the total dose amount of the base region 14. However, a maximum value of the doping concentration of the accumulation region 16 is higher than the maximum value of the doping concentration of the base region 14. Thereby, while the ON-resistance is reduced by making the doping concentration of the accumulation region 16 high, the withstand voltage decrease can be suppressed.

Also, in the examples a to d (16-*a* to 16-*d*), decrease in the withstand voltage is smaller. Thus, the total dose amount of the accumulation region 16 may be 2.5 times the total dose amount of the base region 14 or less. Similarly, the integrated concentration that is obtained by integrating the doping concentration of the accumulation region 16 in the depth direction may be 2.5 times the integrated concentration of the base region 14 or less. Thereby, the ON-resistance can be reduced by further suppressing the withstand voltage decrease.

Also, the withstand voltage in the example a (16-*a*) is almost the same as the withstand voltage in the comparative example (116). On the other hand, the withstand voltage in the example b (16-*b*) is reduced, although only slightly, as compared with the withstand voltage in the comparative example (116). Thus, the total dose amount of the accumulation region 16 may be less than the total dose amount of the base region 14. Similarly, the integrated concentration that is obtained by integrating the doping concentration of the accumulation region 16 in the depth direction may be less than the integrated concentration of the base region 14. Thereby, the ON-resistance can be reduced without decreasing the withstand voltage.

Figure 7:
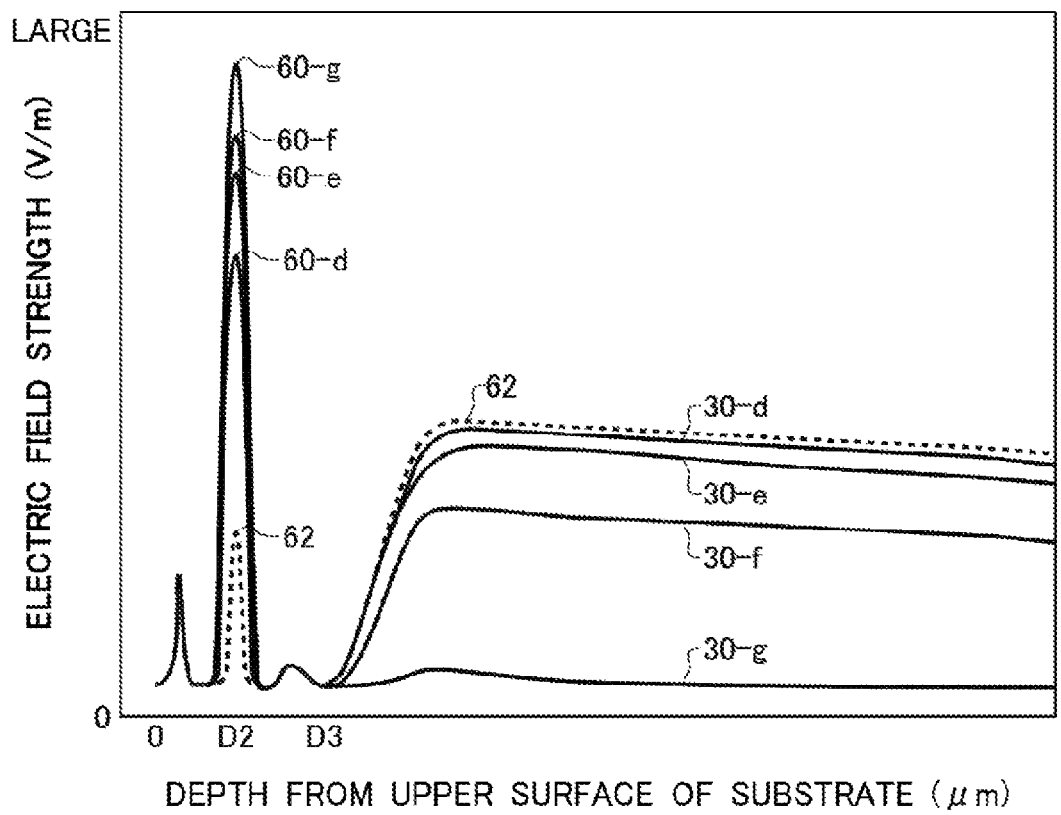
FIG. 7 is a diagram illustrating electric field strength distribution in the depth direction in the examples and the comparative example when the gate voltage is lower than or equal to a threshold, e.g. when 0 V is applied.

FIG. 7 is a diagram illustrating electric field strength distribution in the depth direction in the examples and the comparative example when the gate voltage is lower than or equal to a threshold, e.g. when 0 V is applied. FIG. 7 shows electric field strength distributions 60-*d* to 60-*g* in the examples d to g respectively, where electric field strength distributions 60-*a* to 60-*c* in the examples a to c respectively fall between the electric field strength distribution 62 in the comparative example and the electric field strength distribution 60-*d* in the example d.

When the total dose amount of the accumulation region 16 becomes sufficiently greater than the total dose amount of the base region 14, the accumulation region 16 becomes hard to be depleted. Thus, as shown in FIG. 7, the electric field is concentrated on an interface between the accumulation region 16 and the base region 14 (at the depth D2) and the withstand voltage gets decreased. As described above, the total dose amount of the accumulation region 16 is preferably set in a range such that the withstand voltage can be ensured. As an example, the total dose amount of the accumulation region 16 may be set such that the electric field on the interface between the accumulation region 16 and the base region 14 is smaller than an electric field at the bottom end of the gate trench portion 40.

Figure 8:
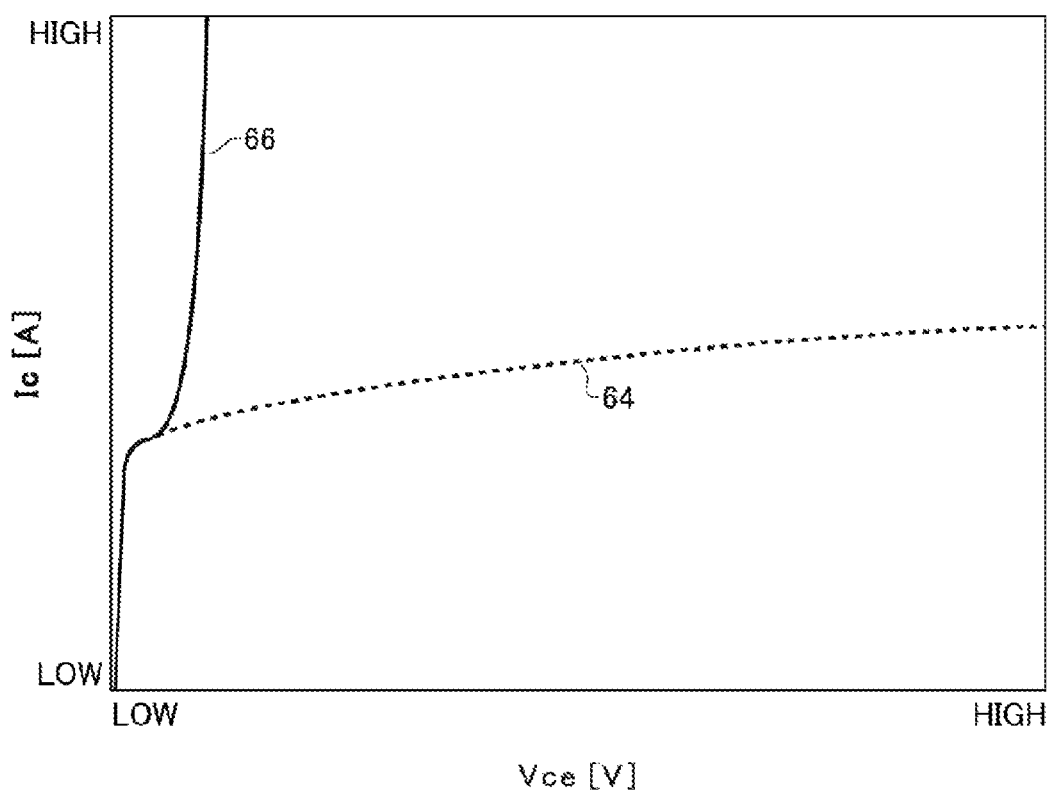
FIG. 8 is a diagram illustrating a FBSOA withstand decreasing phenomenon in the semiconductor device 100.

FIG. 8 is a diagram illustrating a FBSOA (Forward Bias Safe Operating Area) withstand decreasing phenomenon in the semiconductor device 100. FIG. 8 illustrates Vce-Ic characteristics at an ON operation. In FIG. 8, the characteristic 64 represents a usual characteristic of the semiconductor device 100 where dynamic withstand voltage is not decreased, whereas the characteristic 66 represents a characteristic of the semiconductor device where the dynamic withstand voltage is decreased. The dynamic withstand voltage is defined as collector-emitter voltage Vce at the timing that predetermined current flows between the collector and the emitter, when voltage is applied between the collector and the emitter while voltage (Vge) that is higher than or equal to the gate threshold (Vth) is applied between the gate and the emitter. If avalanche occurs when voltage is applied between the collector and the emitter while voltage that is higher than or equal to the gate threshold is applied between the gate and the emitter, avalanche current is superimposed on Ic and the dynamic withstand voltage of the semiconductor device is decreased. By increasing the total dose amount of the accumulation region 16, avalanche on the interface D2 between the base region 14 and the accumulation region 16 becomes easy to occur. As a result, collector-emitter current Ic is increased at low Vce, and the dynamic withstand voltage is decreased as shown in the characteristic 66. That is, the FBSOA withstand is decreased.

Figure 9:
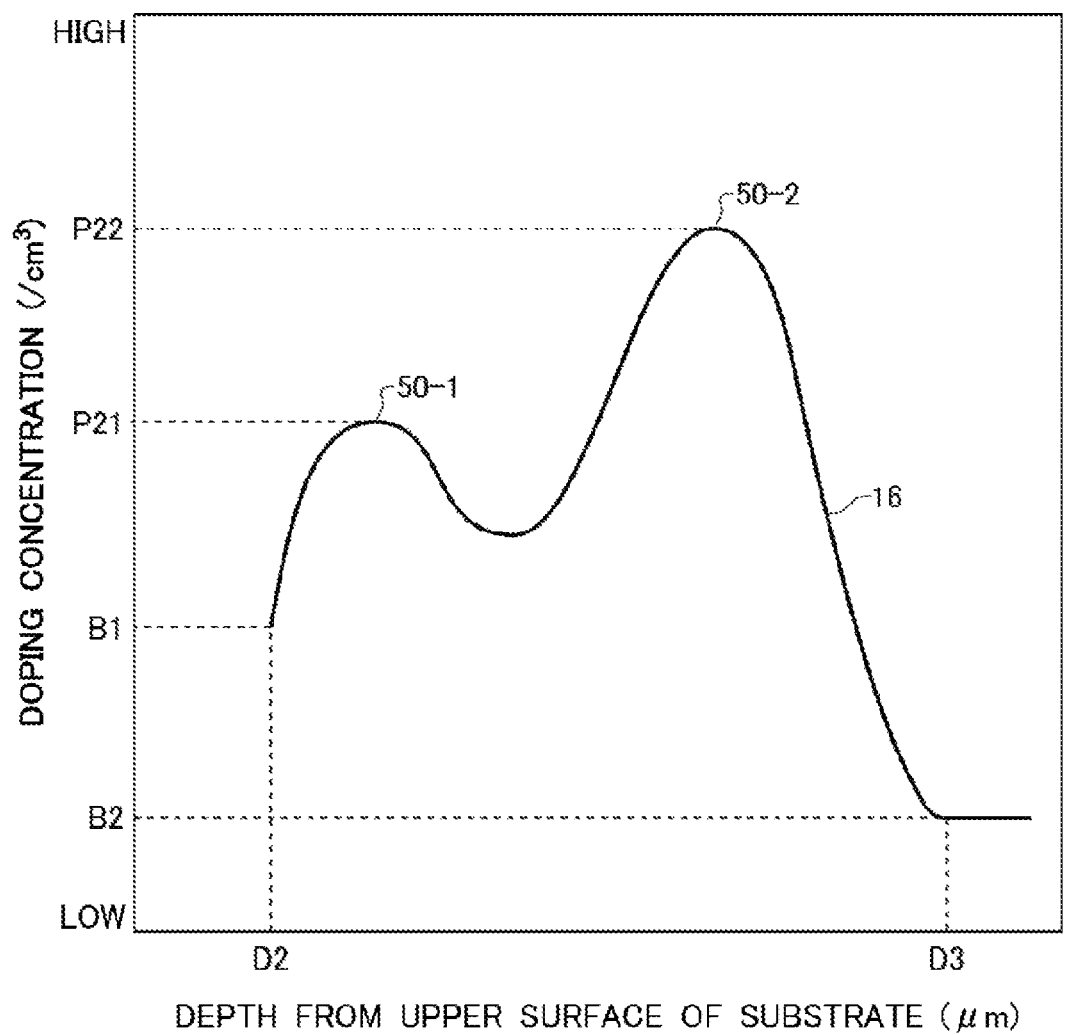
FIG. 9 is a diagram illustrating another exemplary doping concentration distribution of the accumulation region 16 in the depth direction.

FIG. 9 is a diagram illustrating another exemplary doping concentration distribution of the accumulation region 16 in the depth direction. FIG. 9 illustrates a concentration distribution of (N)-type impurities. The doping concentration distribution of the accumulation region 16 in the present example has multiple peaks 50. In FIG. 9, two peaks, i.e. peaks 50-1, 50-2 are indicated. The peak 50 represents a position where the doping concentration reaches the local maximum value of the doping concentration distribution in the depth direction.

Among the multiple peaks 50, doping concentration P21 at the peak 50-1 closest to the base region 14 is lower than doping concentration P22 at the peak 50-2 closest to the drift region 18. The doping concentration P22 may be half the doping concentration P21 or lower. In the present example, concentration B1 of (N)-type impurities at the border position D2 between the base region 14 and the accumulation region 16 is higher than concentration B2 of (N)-type impurities of the drift region 18.

The peak 50-1 may be arranged closer to the base region 14 than the center of the accumulation region 16 in the depth direction (i.e. the center between the border position D2 and the border position D3). The peak 50-2 may be arranged closer to the drift region 18 than the center of the accumulation region 16 in the depth direction.

As in the present example, by making the doping concentration P21 at the peak 50-1 lower than the doping concentration P22 at the peak 50-2, electric field concentration in vicinity of the border between the base region 14 and the accumulation region 16 can be relaxed.

Thereby, the withstand voltage decrease of the semiconductor device 100 can be suppressed, while the ON-voltage is decreased by making the doping concentration of the accumulation region 16 high. Moreover, decrease in the dynamic withstand voltage can be suppressed.

Figure 10:
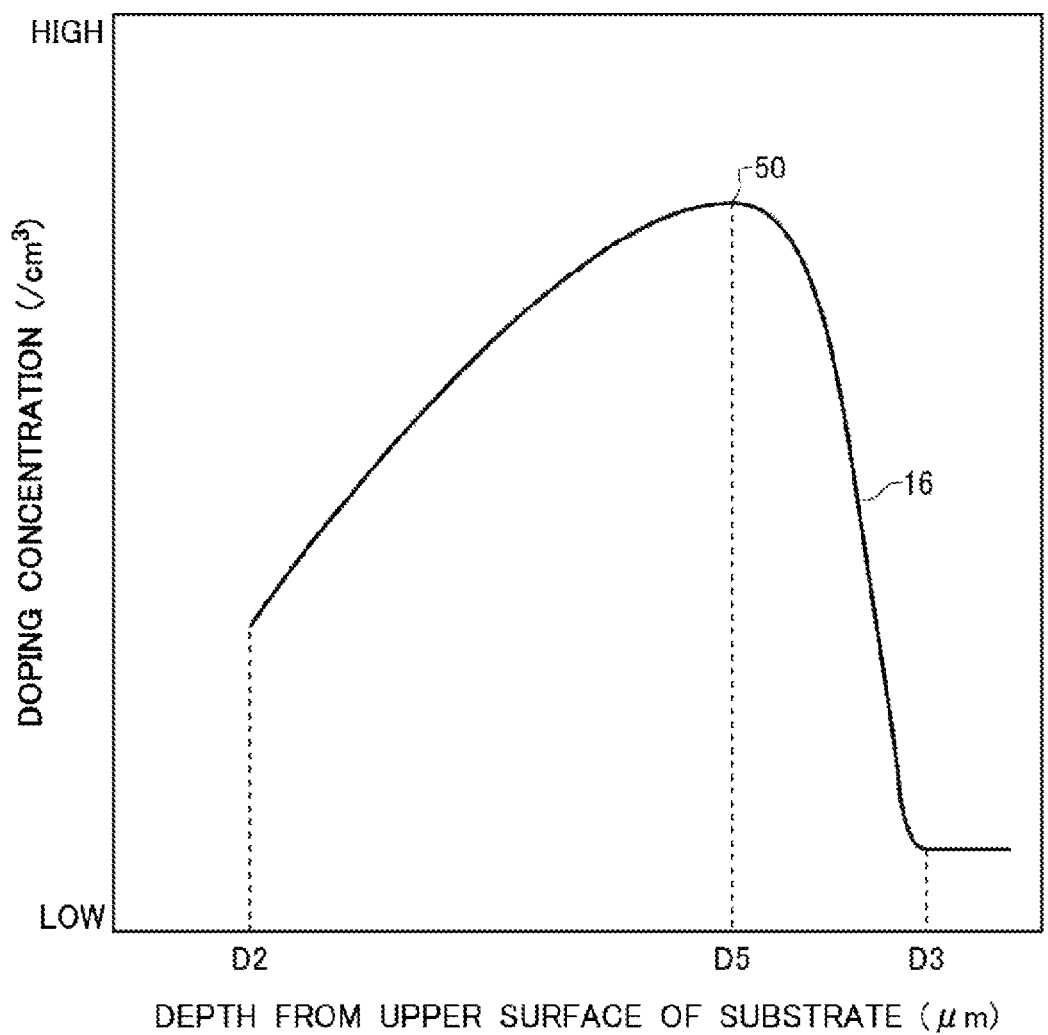
FIG. 10 is a diagram illustrating still another exemplary doping concentration distribution of the accumulation region 16 in the depth direction.

FIG. 10 is a diagram illustrating still another exemplary doping concentration distribution of the accumulation region 16 in the depth direction. In the accumulation region 16 in the present example, upper integrated concentration that is obtained by integrating the doping concentration above the center in the depth direction is less than lower integrated concentration that is obtained by integrating the doping concentration below the center in the depth direction.

That is, in the accumulation region 16, the doping concentration on the base region 14 side is lower than the doping concentration on the drift region 18 side. Also by such doping concentration distribution, the electric field concentration in vicinity of the border between the base region 14 and the accumulation region 16 can be relaxed.

As an example, the doping concentration distribution of the accumulation region 16 in the depth direction has a single peak 50. The depth position D5 of the peak 50 may be arranged closer to the drift region 18 than the center of the accumulation region 16 in the depth direction. In the present example, concentration of (N)-type impurities at the border position D2 between the base region 14 and the accumulation region 16 is higher than concentration of (N)-type impurities of the drift region 18. Thereby, the withstand voltage decrease of the semiconductor device 100 can be suppressed, while the ON-voltage is decreased by making the doping concentration of the accumulation region 16 high. Moreover, decrease in the dynamic withstand voltage can be suppressed.

Figure 11:
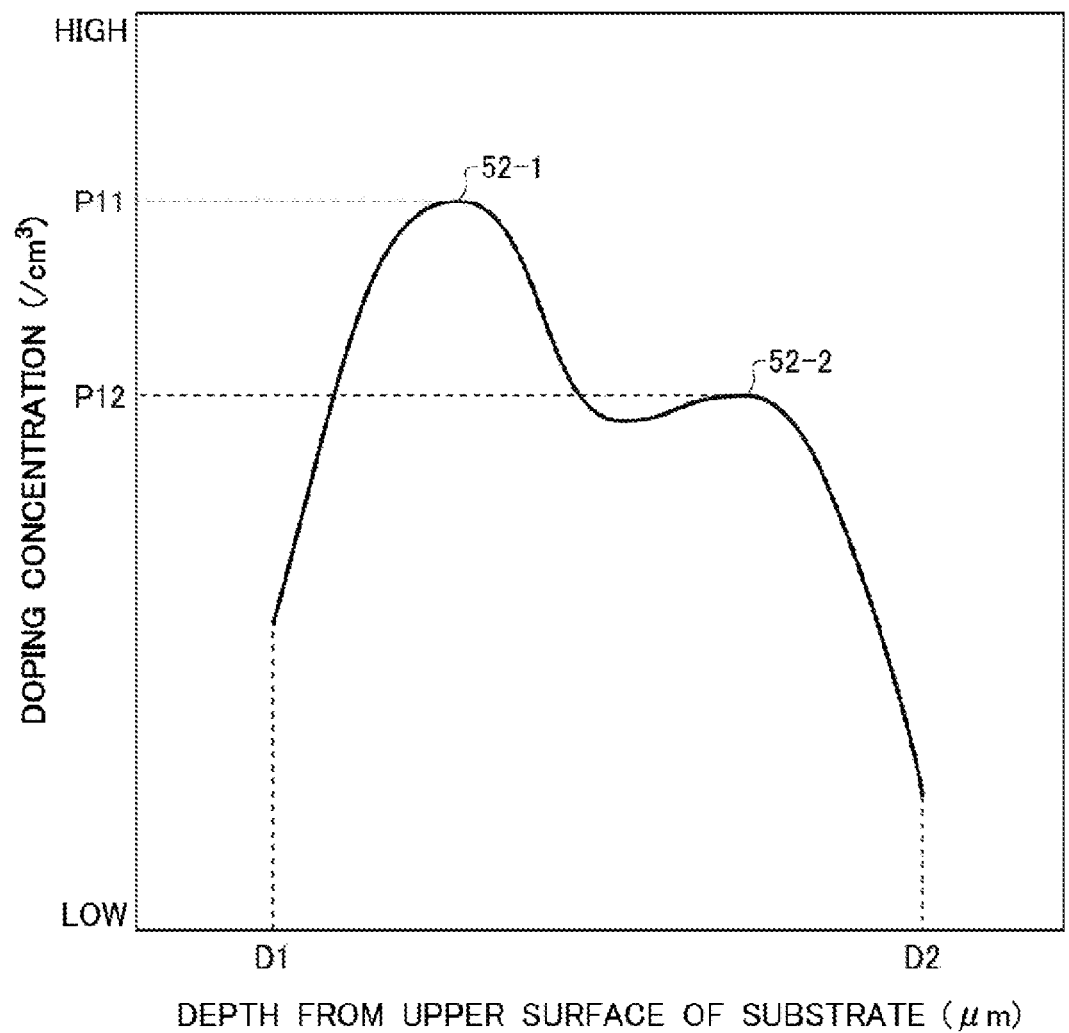
FIG. 11 is a diagram illustrating another exemplary doping concentration distribution of the base region 14 in the depth direction.

FIG. 11 is a diagram illustrating another exemplary doping concentration distribution of the base region 14 in the depth direction. FIG. 11 illustrates a concentration distribution of (P)-type impurities. The doping concentration distribution of the base region 14 in the present example has multiple peaks 52. In FIG. 11, two peaks, i.e. peaks 52-1, 52-2 are indicated.

Among the multiple peaks 52, doping concentration P11 at the peak 52-1 closest to the upper surface of the semiconductor substrate 10 is higher than doping concentration P12 at the peak 52-2 closest to the accumulation region 16. The doping concentration P12 may be half the doping concentration P11 or lower.

The peak 52-1 may be arranged closer to the upper surface of the semiconductor substrate 10 than the center of the base region 14 in the depth direction (i.e. the center between the border position D1 and the border position D2). The peak 52-2 may be arranged closer to the accumulation region 16 than the center of the base region 14 in the depth direction.

As in the present example, by making the doping concentration P12 at the peak 52-2 lower than the doping concentration P11 at the peak 52-1, electric field concentration in vicinity of the border between the base region 14 and the accumulation region 16 can be relaxed. Thereby, the withstand voltage decrease of the semiconductor device 100 can be suppressed, while the ON-voltage is decreased by making the doping concentration of the accumulation region 16 high. Moreover, decrease in the dynamic withstand voltage can be suppressed.

Figure 12:
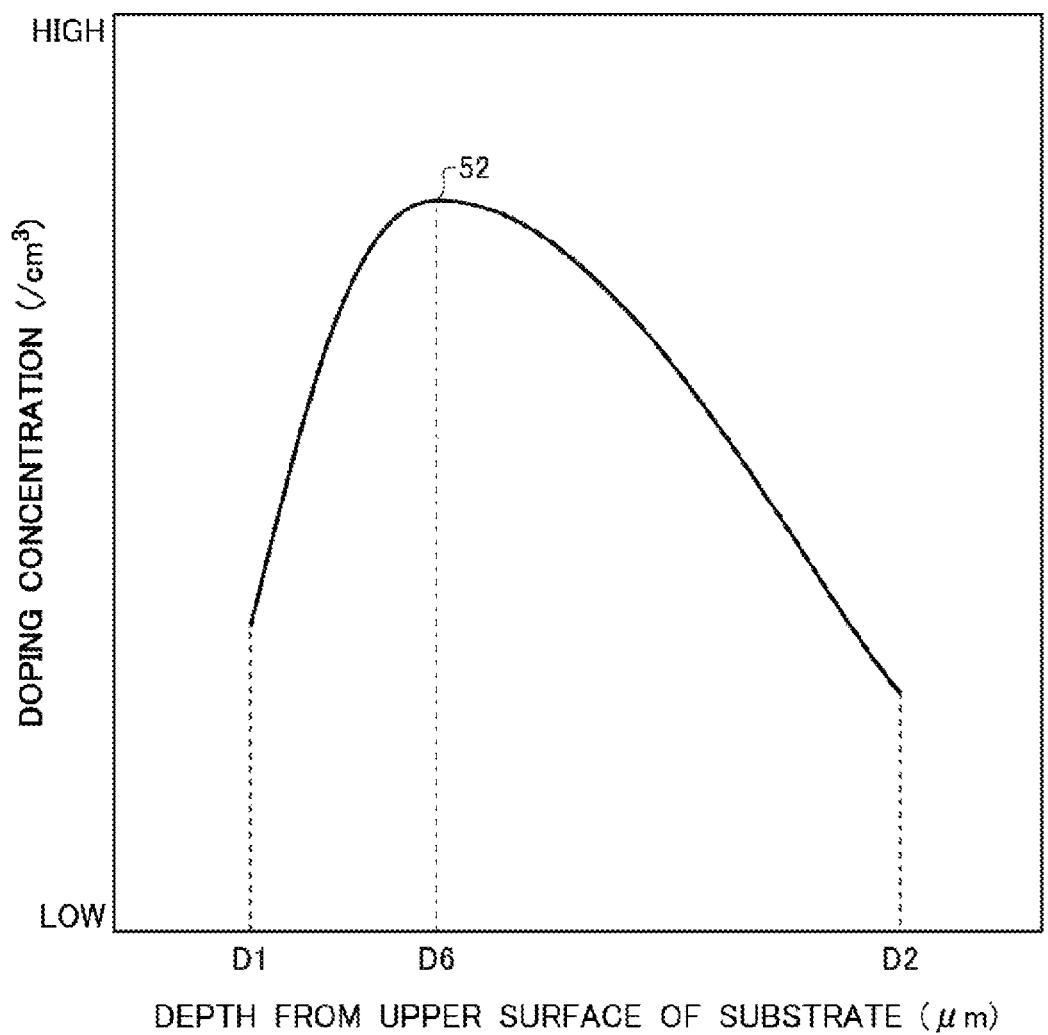
FIG. 12 is a diagram illustrating still another exemplary doping concentration distribution of the base region 14 in the depth direction.

FIG. 12 is a diagram illustrating still another exemplary doping concentration distribution of the base region 14 in the depth direction. In the base region 14 in the present example, upper integrated concentration that is obtained by integrating the doping concentration above the center in the depth direction is more than lower integrated concentration that is obtained by integrating the doping concentration below the center in the depth direction.

That is, in the base region 14, the doping concentration on the accumulation region 16 side is lower than the doping concentration of the upper surface side of the semiconductor substrate 10. Also by such doping concentration distribution, the electric field concentration in vicinity of the border between the base region 14 and the accumulation region 16 can be relaxed.

As an example, the doping concentration distribution of the base region 14 in the depth direction has a single peak 52. The depth position D6 of the peak 52 may be arranged closer to the upper surface of the semiconductor substrate 10 than the center of the base region 14 in the depth direction. Note that the doping concentration distributions of base regions 14 shown in FIG. 11 and FIG. 12 can be combined with the doping concentration distributions of the accumulation regions 16 shown in FIG. 1 to FIG. 10.

Figure 13:
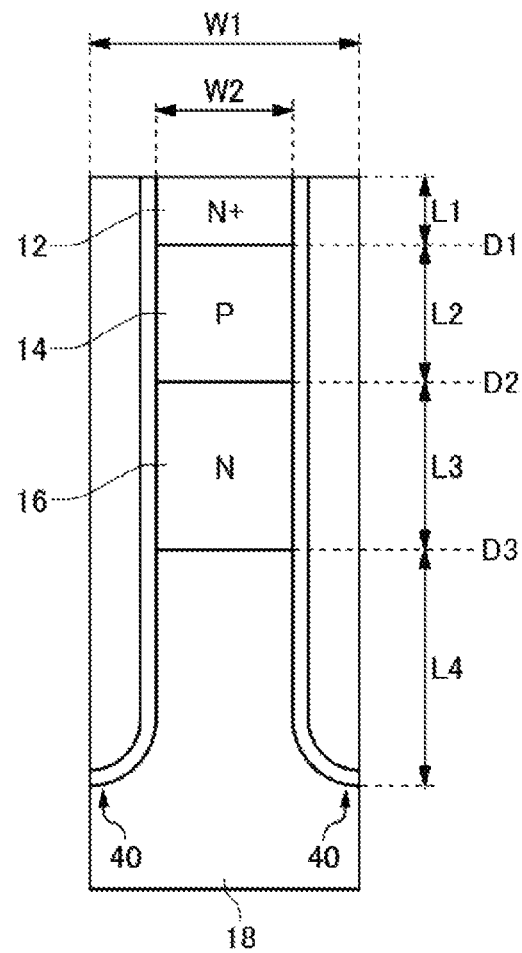
FIG. 13 is an enlarged cross-sectional view of a vicinity of a gate trench portion 40.

FIG. 13 is an enlarged cross-sectional view of a vicinity of the gate trench portion 40. In the present example, an interval between the central portions of two of the gate trench portions 40 is referred to as W1; a width of a mesa region sandwiched by two of the gate trench portions 40 is referred to as W2; a length from the upper surface of the semiconductor substrate 10 to the border D1 between the emitter region 12 and the base region 14 in the depth direction is referred to as L1; a length from the border D1 to a border between the base region 14 and the accumulation region 16 is referred to as L2; a length from the border D2 to the border D3 between the accumulation region 16 and the drift region 18 is referred to as L3; and a length of a protruding part of the gate trench portion 40 below the lower surface of the accumulation region 16 is referred to as L4.

As described above, by making the maximum value of the doping concentration of the accumulation region 16 high, the ON-resistance and the ON-voltage of the semiconductor device 100 can be made small. On the other hand, when the total dose amount of the accumulation region 16 is excessively increased, the withstand voltage and the dynamic withstand voltage of the semiconductor device 100 are decreased. Thus, the length L3 of the accumulation region 16 being smaller enables more easily to suppress the withstand voltage decrease and the withstand voltage decrease of the semiconductor device 100 and to reduce the ON-resistance etc. thereof, at the same time.

As an example, the length L3 of the accumulation region 16 is smaller than or equal to a sum of lengths of the emitter region 12 and the base region 14, i.e. L1+L2. The length L3 of the accumulation region 16 may be smaller than or equal to the length L2 of the base region 14. Also, the length L3 of the accumulation region 16 may be smaller than or equal to the length L4 of the protruding portion of the gate trench portion 40, or may be smaller than or equal to half L4. However, the accumulation region 16 has a length such that the carrier accumulation effect is produced. As an example, the length L3 of the accumulation region 16 is greater than or equal to half the length L2 of the base region 14.

The length L3 of the accumulation region 16 may be smaller than the interval W1 in the lateral direction between the central portions of two of the gate trench portions 40 that are lined up in the lateral direction. The length L3 of the accumulation region 16 may be smaller than the width (W1−W2) of the gate trench portion 40. Also, the mesa width W2 may be smaller than the width (W1−W2) of the gate trench portion 40. Also, the length L3 of the accumulation region 16 may be smaller than the mesa width W2.

Also, in the accumulation region 16, an integrated value A that is obtained by integrating the doping concentration of the accumulation region 16 in the lateral direction at a depth position corresponding to a peak concentration of the doping concentration distribution of the accumulation region 16 in the depth direction in a section sandwiched by two of the gate trench portions 40 may be greater than half the value of the critical integrated concentration $n_c$ of the accumulation region 16. Further, the integrated value A may be greater than the critical integrated concentration $n_c$. Furthermore, the integrated value A may be greater than ten times the critical integrated concentration $n_c$. Furthermore, the integrated value A may be greater than thirty times the critical integrated concentration $n_c$.

Here, the critical integrated concentration is regarded as follows. A value of electric field strength at which an avalanche breakdown occurs is referred to as Critical Electric Field Strength. The avalanche breakdown depends on component elements of semiconductors, impurities doped into the semiconductors, and concentration of the impurities. When $N_D$ and $E_C$ denote donor concentration and critical electric field strength respectively, using the impact ionization coefficient of silicon (Si) to calculate the ionization integral, the critical electric field strength $E_C$ is represented by Equation 1.

$$Ec = 4010 \cdot (N_D)^{1/8} \qquad [\text{Equation 1}]$$

As can be seen from Equation 1, the critical electric field strength Ec is determined once the donor concentration $N_D$ is determined. Also, Poisson's equation can, when only a one-dimensional direction (assuming the x direction) is considered, be represented by Equation 2.

$$dE/dx = (q/\varepsilon_r\varepsilon_0)(p - n + N_D - N_A) \qquad [\text{Equation 2}]$$

Here, q denotes elementary charge (1.062×10$^{15}$[C]), ($\varepsilon_0$ denotes permittivity of vacuum (8.854×10$^{-14}$[F/cm]), and $\varepsilon_r$ denotes relative permittivity of the substance. For silicon, relative permittivity $\varepsilon_r$=11.9. P denotes the hole concentration, n denotes the electron concentration and $N_A$ denotes the acceptor concentration.

Since an (N)-type layer is only considered in a one-sided abrupt junction, it is regarded that no acceptor exists (i.e. $N_A$=0). Further, assuming a depletion layer, or a perfectly depleted layer, where no hole or electron exists (i.e. n=p=0), Equation 3 is obtained by integrating Equation 2 over the depth x.

$$E = (q/\varepsilon_r\varepsilon_0)\int N_D dx \qquad [\text{Equation 3}]$$

A position of p-n junction is regarded as the origin 0, and a position of the end portion of the depletion layer, in the (N)-type layer, at a position on the opposite side of the p-n junction is regarded as $x_0$. Then, by integrating the entire depletion layer from 0 to $x_0$, E in Equation 3 takes the maximum value of the electric field strength distribution. When this is regarded as $E_m$, $E_m$ is represented by Equation 4.

$$E_m = (q/\varepsilon_r\varepsilon_0)\int_0^{x_0} N_D dx \qquad [\text{Equation 4}]$$

When the maximum value $E_m$ in the electric field strength distribution reaches the critical electric field strength $E_c$, Equation 4 is represented by Equation 5.

$$E_C(\varepsilon_r\varepsilon_0/q) = \int_0^{x_0} N_D dx \qquad [\text{Equation}]5$$

Both sides of Equation 5 are constants. The right-hand side of Equation 5 refers to the perfectly depleted section in the (N)-type layer, and is thus expressed as the critical integrated concentration $n_c$ according to the definitions described in the present specification. Thereby, the following Equation 6 is obtained. The Equation 6 represents a correlation between the critical integrated concentration $n_c$ and the critical electric field strength $E_c$. In this manner, the critical integrated concentration $n_c$ is a constant corresponding to the critical electric field strength $E_c$.

$$E_C(\varepsilon_r\varepsilon_0/q) = n_C \qquad [\text{Equation 6}]$$

Note that, in the above-described calculation, the concentration distribution of the (N)-type layer in x direction is assumed as uniform in the donor concentration $N_D$. The critical electric field strength $E_c$ depends on the donor concentration $N_D$ of the (N)-type layer (Equation 5), and thus the critical integrated concentration $n_c$ also depends on the donor concentration $N_D$ of the (N)-type layer. In a range where the donor concentration $N_D$ is $1\times10^{13}$ to $1\times10^{15}$ (cm$^3$), the critical integrated concentration $n_c$ is $1.1\times10^{12}$ to $2.0\times10^{12}$ (/cm$^2$). Based on that the donor concentration ranges over several orders of magnitude, the critical integrated concentration $n_c$ can be regarded as a substantial constant.

For example, in an example where rated voltage of the semiconductor device 100 in the embodiment is 1200 V, assuming that the donor concentration $N_D$ of the base region 14 is $6.1\times10^{13}$ (/cm$^3$), the critical integrated concentration $n_c$ can be evaluated as about $1.4\times10^{12}$ (/cm$^2$) from Equation 6. Also, in an example where the rated voltage is 600 V, assuming that the donor concentration $N_D$ of the base region 14 is $1.4\times10^{14}$ (/cm$^3$), the critical integrated concentration $n_c$ can be evaluated as about $1.55\times10^{12}$ (/cm$^2$) from Equation 6. Also, the above-described discussion regarding critical total impurity amount is not limited to silicon, and can be applied to wide bandgap semiconductors such as silicon carbide (SiC), gallium nitride (GaN), diamond, and gallium oxide (Ga$_2$O$_3$). That is, respective values of the materials can be used for the impact ionization coefficient to derive Equation 1, or for the relative permittivity to derive Equation 2.

In case L4 is sufficiently longer than L3, when collector-emitter voltage is zero, a width B of the depletion layer in the lateral direction is a value that is determined by flat-band voltage, the depletion layer expanding in the drift region 18 that is sandwiched by two of the gate trench portions 40 and its depth is referred to as L4. Thus, when the width B of the depletion layer is smaller than half the value of W2, the drift region 18 referred to as L4 can be sufficiently depleted even when collector-emitter voltage is zero. Thereby, electric field strength of the p-n junction between the base region 14 and the accumulation region 16 can be made sufficiently low.

Figure 14:
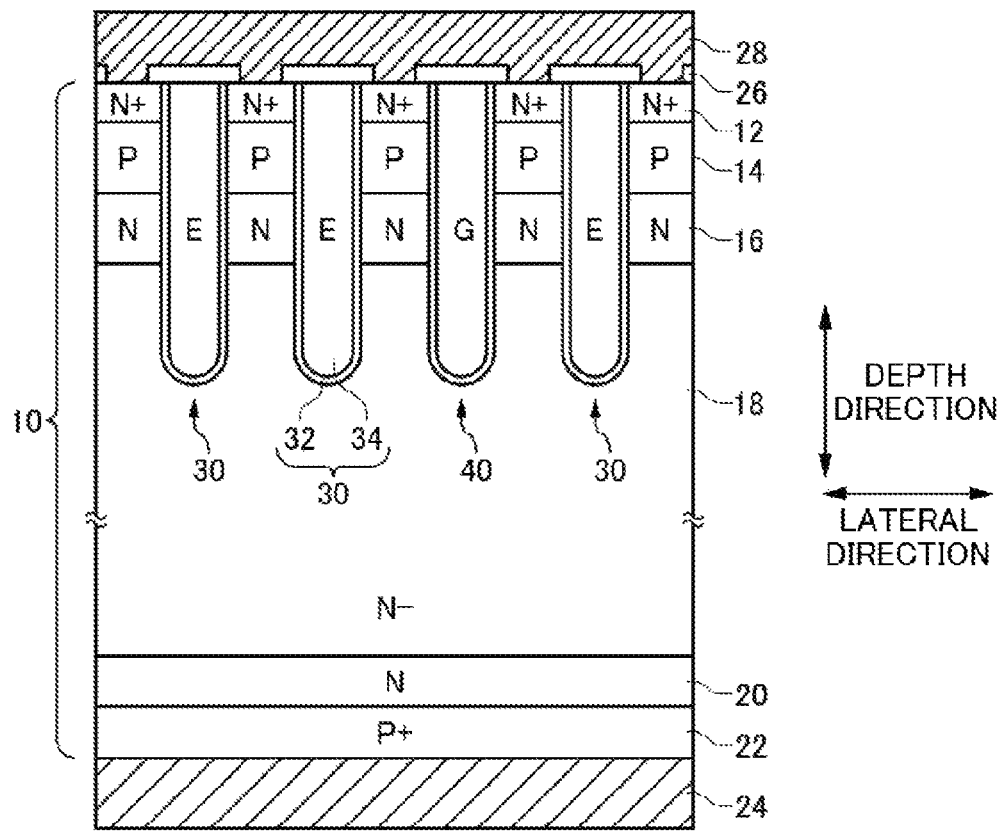
FIG. 14 is a diagram illustrating a cross section of a semiconductor device 200 according to another embodiment of the present invention.

FIG. 14 is a diagram illustrating a cross section of a semiconductor device 200 according to another embodiment of the present invention. The semiconductor device 200 includes dummy trench portions 30, as alternatives to a part of the gate trench portions 40 in the configuration of the semiconductor device 100. In other respects, it has the same configuration as that of the semiconductor device 100.

The dummy trench portion 30 has a similar structure as that of the gate trench portion 40. The dummy trench portion 30 is formed extending from the upper surface of the semiconductor substrate 10 to the drift region 18, passing through the emitter region 12, the base region 14 and the accumulation region 16. The dummy trench portion 30 has a dummy insulating film 32 and a dummy conductive portion 34 that are formed on an inner wall of the trench. However, the dummy conductive portion 34 is electrically connected to the emitter electrode 28.

By the dummy trench portions 30 being provided as alternatives to a part of the gate trench portions 40, the electron injection enhancement effect (IE effect) is produced and the ON-resistance is decreased. The dummy trench portions 30 and the gate trench portions 40 may be alternately arranged. Two or more dummy trench portions 30 may be arranged between two of the gate trench portions 40. In FIG. 14, a direction where the dummy trench portions 30 and the gate trench portions 40 are aligned is a lateral direction. The lateral direction is perpendicular to the depth direction, and perpendicular to a direction which the trench portions that are formed in stripes on the upper surface of the semiconductor substrate 10 extend to.

Figure 15:
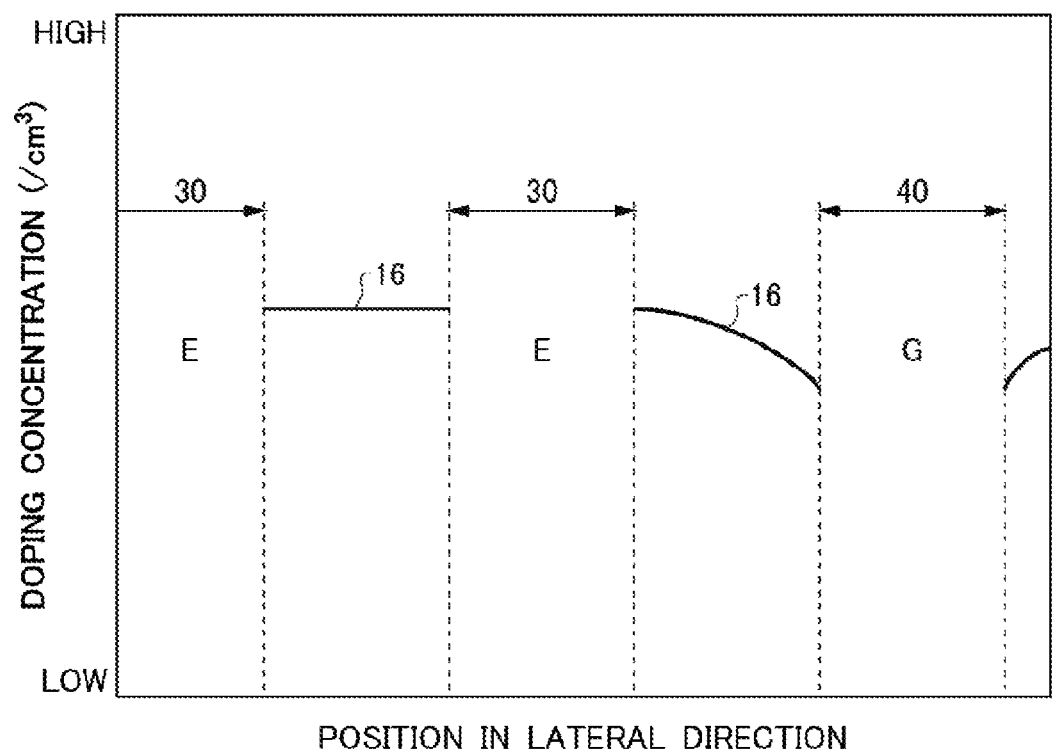
FIG. 15 is a diagram illustrating a doping concentration distribution, in the lateral direction, of the accumulation region 16 sandwiched by trench portions.

FIG. 15 is a diagram illustrating an exemplary doping concentration distribution, in the lateral direction, of the accumulation region 16 sandwiched by trench portions. In the accumulation region 16 in the present example, the doping concentration of parts adjacent to the dummy trench portions 30 is higher than the doping concentration of parts adjacent to the gate trench portions 40. In the accumulation region 16, the doping concentration of parts adjacent to the dummy trench portions 30 may be twice the doping concentration of parts adjacent to the gate trench portions 40 or higher.

As an example, an inclination of the doping concentration distribution, in the lateral direction, of the accumulation region 16 that is sandwiched by two of the dummy trench portions 30 is smaller than an inclination of the doping concentration distribution, in the lateral direction, of the accumulation region 16 that is sandwiched by the dummy trench portion 30 and the gate trench portion 40. The doping concentration in the lateral direction of the accumulation region 16 that is sandwiched by the dummy trench portion 30 and the gate trench portion 40 preferably changes continuously.

By making the doping concentration of a part of the accumulation region 16 adjacent to the gate trench portion 40 low, the electric field concentration in the parts adjacent to the gate trench portion 40 within the interface between the accumulation region 16 and the base region 14 can be relaxed. Thereby, the withstand voltage of the semiconductor device 100 can be improved.

Figure 16:
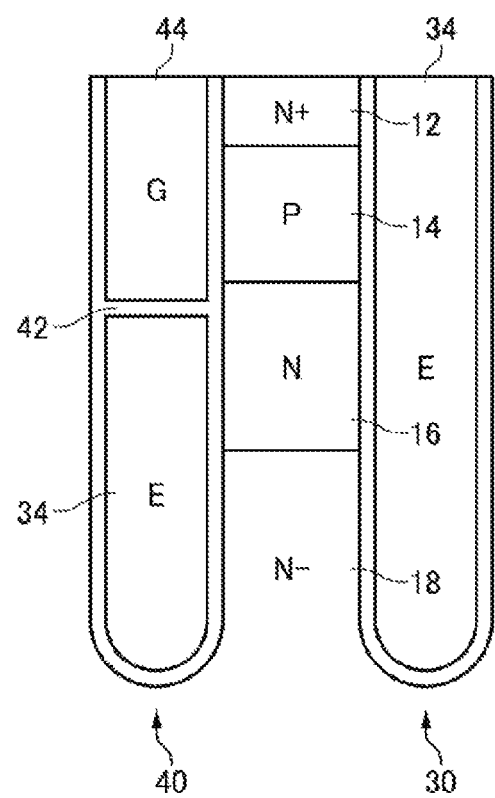
FIG. 16 is a diagram illustrating another exemplary structure of the gate trench portion 40.

FIG. 16 is a diagram illustrating another exemplary structure of the gate trench portion 40. In respects except the gate trench portion 40, it has similar configuration as that of the semiconductor device 100 in any of the aspects described in FIGS. 1 to 15. In FIG. 16, the gate trench portion 40 is illustrated in the semiconductor device 200, but the gate trench portion 40 in the semiconductor device 100 may have a similar structure.

The gate trench portion 40 in the present example further includes the dummy conductive portion 34 that is formed below the gate conductive portion 44. The dummy conductive portion 34 is formed of, for example, polysilicon to which impurities added. The dummy conductive portion 34 is preferably electrically connected to the emitter electrode 28. By such configuration, the electric field concentration at the bottom end portion of the gate trench portion 40 can be relaxed.

At least partial region of the accumulation region 16 is formed facing the dummy conductive portion 34. In the present example, major part of the accumulation region 16 is formed facing the dummy conductive portion 34. The half or more of the accumulation region 16 in the depth direction may be formed facing the dummy conductive portion 34, and the three fourths or more of the accumulation region 16 in the depth direction may be formed facing the dummy conductive portion 34.

The dummy conductive portion 34 has a part protruding below the lower surface of the accumulation region 16. The half or more part of the dummy conductive portion 34 in the depth direction may protrude below the accumulation region 16.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate;
a drift region of first conductivity type that is formed in the semiconductor substrate;
an accumulation region of first conductivity type that is formed above the drift region and has a higher concentration than a concentration of the drift region;
a base region of second conductivity type that is formed above the accumulation region; and
a gate trench portion that is formed extending from an upper surface of the semiconductor substrate to the drift region, passing through the base region and the accumulation region, wherein
a maximum value of a doping concentration of the accumulation region is greater than a maximum value of a doping concentration of the base region,
a doping concentration distribution of the accumulation region in a depth direction has at least one peak, and a doping concentration distribution of the base region in the depth direction has at least one peak, and
an integrated concentration that is obtained by integrating the doping concentration of the accumulation region in the depth direction of the semiconductor substrate is less than an integrated concentration that is obtained by integrating the doping concentration of the base region in the depth direction of the semiconductor substrate.

2. The semiconductor device according to claim 1, wherein
the maximum value of the doping concentration of the accumulation region is five times the maximum value of the doping concentration of the base region or smaller.

3. The semiconductor device according to claim 1, wherein
the maximum value of the doping concentration of the accumulation region is 1.5 times the maximum value of the doping concentration of the base region or greater.

4. The semiconductor device according to claim 1, wherein
the doping concentration distribution of the accumulation region in the depth direction has multiple peaks; and
a doping concentration at a peak closest to the base region among the multiple peaks is lower than a doping concentration at a peak closest to the drift region.

5. The semiconductor device according to claim 1, wherein
the doping concentration distribution of the base region in the depth direction has multiple peaks; and a doping concentration at a peak closest to the upper surface side of the semiconductor substrate among the multiple peaks in the doping concentration distribution of the base region is higher than a doping concentration at a peak closest to the accumulation region side.

6. The semiconductor device according to claim 1, wherein
an upper integrated concentration that is obtained by integrating the doping concentration of the base region above a center in the depth direction of the base region is more than a lower integrated concentration that is obtained by integrating the doping concentration of the base region below the center in the depth direction of the base region.

7. The semiconductor device according to claim 1, wherein
a depth position where the doping concentration of the accumulation region takes the maximum value is closer to the drift region than a center of the accumulation region in the depth direction.

8. The semiconductor device according to claim 1, further comprising
a dummy trench portion that is formed extending from an upper surface of the semiconductor substrate to the drift region, passing through the base region and the accumulation region, wherein
a doping concentration of a part, in the accumulation region, adjacent to the dummy trench portion is higher than a doping concentration of a part adjacent to the gate trench portion.

9. The semiconductor device according to claim 1, wherein
a length of the accumulation region in the depth direction is smaller than or equal to a length of the base region in the depth direction.

10. The semiconductor device according to claim 1, wherein
a length of the accumulation region in the depth direction is smaller than or equal to a length of a protruding part of the gate trench portion below a bottom end of the accumulation region.

11. The semiconductor device according to claim 1, wherein
the accumulation region is formed in a region sandwiched by two of the gate trench portions that are lined up in a lateral direction; and
a length of the accumulation region in the depth direction is smaller than an interval in the lateral direction between central portions of the two of the gate trench portions.

12. The semiconductor device according to claim 1, wherein
the accumulation region is formed in a region sandwiched by two of the gate trench portions that are lined up in a lateral direction; and
an integrated value that is obtained by integrating the doping concentration of the accumulation region in the lateral direction at a depth position corresponding to a peak concentration in the doping concentration distribution of the accumulation region in the depth direction is greater than half a value of a critical integrated concentration of the accumulation region.

13. The semiconductor device according to claim 1, wherein
the gate trench portion has:
a trench that is formed extending from an upper surface of the semiconductor substrate to the drift region, passing through the base region and the accumulation region;
an insulating film that is formed on an inner wall of the trench;
a gate conductive portion that is formed, in the trench, facing the base region; and
a dummy conductive portion that is formed below the gate conductive portion and insulated from the gate conductive portion, and
at least partial region of the accumulation region is formed facing the dummy conductive portion.

14. The semiconductor device according to claim 1, wherein
the accumulation region contacts with the drift region.

* * * * *